(12) United States Patent
Leiting et al.

(10) Patent No.: US 10,090,680 B2
(45) Date of Patent: Oct. 2, 2018

(54) HIGH ACCURACY MAINS FILTER MONITORING FOR A MULTI-PHASE POWER SYSTEM

(71) Applicants: Dirk Volker Leiting, Alpen (DE); Jörg Kretschmann, Kempen (DE); Jan van Leyen, Kevelar (DE); Stephan Engelhardt, Sonsbeck (DE)

(72) Inventors: Dirk Volker Leiting, Alpen (DE); Jörg Kretschmann, Kempen (DE); Jan van Leyen, Kevelar (DE); Stephan Engelhardt, Sonsbeck (DE)

(73) Assignee: Woodward Kempen GmbH, Kempen (DE)

( * ) Notice: Subject to any disclaimer, the term of this patent is extended or adjusted under 35 U.S.C. 154(b) by 0 days.

(21) Appl. No.: 15/668,808

(22) Filed: Aug. 4, 2017

(65) Prior Publication Data

US 2017/0331296 A1    Nov. 16, 2017

Related U.S. Application Data

(63) Continuation of application No. PCT/EP2016/051570, filed on Jan. 26, 2016.

(30) Foreign Application Priority Data

Feb. 6, 2015    (DE) .................. 10 2015 101 766

(51) Int. Cl.
*H02M 5/458* (2006.01)
*H02J 3/38* (2006.01)
(Continued)

(52) U.S. Cl.
CPC .............. *H02J 3/386* (2013.01); *G01R 19/10* (2013.01); *G01R 31/42* (2013.01); *H02J 3/01* (2013.01)

(58) Field of Classification Search
CPC ........ H02M 1/08; H02M 1/126; H02M 1/143; H02M 5/40; H02M 5/42; H02M 5/458
(Continued)

(56) References Cited

U.S. PATENT DOCUMENTS 6,507,505 B2 *    1/2003    Oka ..................... H02M 1/12
                                                                307/105
8,898,025 B2      11/2014   Yin et al.
2011/0057517 A1   3/2011    Zhang

FOREIGN PATENT DOCUMENTS

CN    104124876 A    10/2014
CN    104205603 A    12/2014
(Continued)

*Primary Examiner* — Jeffrey Sterrett
(74) *Attorney, Agent, or Firm* — Reinhart Boerner Van Deuren P.C.

(57) ABSTRACT

Provided is an apparatus for delivering electrical power, in particular for delivering regeneratively produced electrical power, which has at least one converter and at least one filter for matching the delivery of power by the converter to a load impedance. Also provided is a method for operating the apparatus for delivering electrical power which allows improved monitoring of the functioning of the filters or mains filters and which uses means for determining at least one filter current in at least one filter, which means are designed in such a manner that said means make it possible to determine the at least one filter current during operation of the apparatus. Comparison means are provided and generate an error information signal using the desired value and actual value of the filter current and a predefinable error criterion.

16 Claims, 7 Drawing Sheets

(51) Int. Cl.
  *H02J 3/01*    (2006.01)
  *G01R 19/10*   (2006.01)
  *G01R 31/42*   (2006.01)

(58) Field of Classification Search
  USPC ........ 363/34, 37, 39, 40, 47, 48, 74, 78, 84,
                                   363/89, 95, 97, 98
  See application file for complete search history.

(56)         References Cited

FOREIGN PATENT DOCUMENTS

DE    10 2011 001 786 A1    10/2012
DE    10 2013 100 246 A1    7/2014
EP         0 645 866 A1     3/1995
EP         2 814 150 A2    12/2014
EP         2 833 535 A1     2/2015
WO    WO 2006/081531 A2     8/2006

\* cited by examiner

HIGH ACCURACY MAINS FILTER MONITORING FOR A MULTI-PHASE POWER SYSTEM

CROSS-REFERENCE TO RELATED PATENT APPLICATIONS

This patent application is a continuation of PCT/EP2016/051570, filed Jan. 26, 2016, which claims the benefit of German Application No. 10 2015 101 766.0, filed Feb. 6, 2015, the entire teachings and disclosure of which are incorporated herein by reference thereto.

FIELD OF THE INVENTION

The invention relates to an apparatus for delivering electrical power, in particular for delivering regeneratively produced electrical power to a load impedance, having at least one converter and at least one filter. The invention further relates to a method for operating an apparatus for delivering electrical power, in particular for delivering regeneratively produced electrical power to a load impedance, having at least one converter and at least one filter. Finally, the invention also relates to a computer program product for performing a method according to the invention.

BACKGROUND OF THE INVENTION

Apparatus for delivering electrical power to a load impedance, delivering the electrical power via a converter, generally have filters to match the power delivery of the converter to the load impedance. Typical examples of such apparatus are, for example, photovoltaic systems and wind power plants, which deliver their electrical power to a load or a load network. The filters of the apparatus allow minimisation of the power losses of the converter and are generally also used to suppress or reduce the delivery of harmonics to the load. Correct functioning of the filters is very important in matching the apparatus to the load impedance. If the filter deviates too far from the established specification, this can lead to excessive power losses of the apparatus. These can result in total failure or also destruction of the system due to poor functionality of the filter. Apparatus with high power output, in particular, for example wind turbines in the MW range, require optimum connection to the load impedances, thus for example to a network, in order to minimise power losses and failures. Also, reducing oscillations (harmonics), delivered by the converters due to the switching frequencies used, is an important function of the filter used. These harmonics can generate faults in the loads and must be sufficiently damped via the filters. In particular when delivering the electrical power to an electrical network, high demands of the power grid operator must be taken into consideration here, which call for both impedance matching and a maximum value for the harmonic oscillations (approximately 1 kHz-10 kHz). Correct functioning of each filter or group of filters, however, is important when using apparatus for delivering electrical power to a load impedance.

In the state of the art, from U.S. Pat. No. 8,898,025 B2 it is known to determine the functioning of the present filters by comparison of calculated and predefined reactive power during a transition from pre-charge to a run state of the wind turbine. In doing so sensors are used which serve to measure the power output. While the method known from the state of the art allows a check of the functioning of the filters or the mains filters of a wind turbine, the measuring transducers used are nevertheless designed for the relatively high power outputs of the wind turbine. The output currents, however, are between 10 and 100 times greater than the currents occurring in the filters or mains filters. The known method therefore allows only a very imprecise determination of the functioning of the filters. The measurement therefore does not allow precise conclusions to be drawn about specific problems of individual modules, for example due to ageing or the use of incorrect components during assembly. In addition, the checking of the filters can only take place during the system start-up procedure, meaning that a defect of the filters can only be detected during the next start-up procedure. Thus, there is a risk of damage to the wind turbine due to a defective filter or of reduced operating time through unplanned outages for repairs. This is problematic in particular in hard-to-access apparatus, for example offshore wind turbines.

Finally, European patent application EP 0 645 866 A1 discloses a method of monitoring the phase angle between filter current and filter voltage for each phase of a filter, in order to check optimum function of the filter in the range of the nominal frequency. Monitoring of the filter currents in respect of defined desired values is not known from this European patent application.

The object of the present invention is therefore to provide an apparatus for delivering electrical power and a corresponding method for operating an apparatus for delivering electrical power, allowing improved monitoring of the functioning of the filters or mains filters.

BRIEF SUMMARY OF THE INVENTION

According to a first teaching of the present invention the object outlined is achieved in that means for determining at least one filter current in at least one filter are provided, which are designed to allow a determination of the at least one filter current during operation of the apparatus.

Unlike in the state of the art, means for determining at least one filter current are explicitly used. In this way, it is possible to monitor the filter not only during the start-up procedure but whenever there is voltage applied to the filter, thus for example during pre-charge, at a standstill or also in normal operation with power output. With the specific filter current values, it is possible to continuously control the functioning of the filters during operation of the system. In contrast to the method known from the state of the art and the known apparatus, the means for determining the filter current can focus on the order of magnitude of the filter currents without any problems, so that high accuracy in determining the filter currents can be achieved. As a result, with the apparatus according to the invention the functioning of the filters can be monitored continuously or at certain times. The more precise filter current determination also allows early indications about ageing processes or deviations of the mains filters from their predefined specification. Repair or exchange can therefore for example already be planned before the apparatus fails. For example, continuous monitoring of the filter currents also allows components deviating from the specification to be replaced during routine maintenance of the apparatus, as soon as the filter currents determined give cause for this. A sudden failure can in this way be prevented.

According to a first embodiment of the apparatus according to the invention the means for determining the at least one filter current have at least one current sensor for measuring the current in at least one phase of the at least one filter. Apparatus for delivering electrical power to a load network normally have a three-phase configuration. The filters are operated either in a star connection or a delta connection parallel to the power outputs of the apparatus. If, for example, a current measurements using a current sensor is performed in only one phase of the at least one filter, almost all possible sources of error, in particular the deviation from the nominal values of the components, can be detected with minimal effort when the filter is in a star connection. If the filter currents of two phases of a mains filter are measured, e.g. by differential measurement using a current transformer, a filter in a delta connection topology can also be monitored in relation to the function of all components. The same also applies, of course, when measuring all three filter current phases.

If, according to a further embodiment of the apparatus, at least one current sensor is provided, which is designed to measure the differential currents of two phases of at least one filter, filter monitoring can be carried out with minimum effort both with a star connection and with a delta connection, thus independently of the topology of the respective filter, and at the same time all possible potential errors are determined.

In filter current measurement, preferably inductive current transformers, for example with iron core, Rogowski current transformers or current transformers with Hall sensors are used, which are well-known to a person skilled in the art. These sensors are characterised by low cost and sufficient accuracy. Other types of current sensors such as shunts are also conceivable, however.

According to a further embodiment of the apparatus at least one filter group is provided, wherein the means for determining the filter currents at least to some extent allow a determination of the filter currents of the individual filter groups, so that the functioning of individual filter groups can be monitored. A filter group by definition comprises a plurality of filters. Filter groups are, for example, used when individual filters are matched to specific frequencies, e.g. the switching frequency or its harmonics. A further reason may be that the apparatus has a high power output, for example at least 1.5 MW, or to ensure an economical filter construction by using available components and parts. A number of filter groups are also used for power deliveries of at least 1.5 MW, so that cheaper parts can be employed. These filter groups can also be monitored individually with the apparatus according to the invention.

If the apparatus according to a further embodiment for delivering electrical power has a mains connection and at least one mains filters is provided for, more secure operation of the apparatus on an electricity grid can be ensured. The mains filter monitoring during operation ensures that in the event of deviations from normal operation advance action is possible. In particular in apparatus with a power in excess of 1.5 MW downtimes can be reduced by targeted maintenance operations, for example by early exchange of a filter capacitor, and the efficiency of the apparatus increased.

According to a next embodiment the apparatus for delivering electrical power is a wind turbine with a double-fed asynchronous generator or a wind turbine with a synchronous generator. When using a double-fed asynchronous generator only part of the electrical current generated is passed through the converter, whereas with a synchronous generator all the power is passed through the converter. herein this case it does not matter which type of synchronous generator is involved, for example electrically excited or excited by permanent magnet. The correct functioning of the mains filters as a result of the mains filter monitoring ensures high availability of the wind turbines to the grid and prevents possible damage to the wind turbine due to failure of a filter.

In wind turbines with a double-fed asynchronous generator also if variously arranged filter groups are used, which for example are provided between stator and grid, between grid-side converter and grid or between stator connection point and grid-side converter and the grid, these can also be individually monitored so as to allow optimum operation of the apparatus. It is also conceivable, however, for the apparatus according to the invention to be used in other apparatus for delivering regeneratively generated electrical power to a grid having a converter, for example photovoltaic systems or hydroelectric power plants.

The at least one filter is configured as an absorption circuit, high-pass, low-pass or RC filter, or higher order filter. By monitoring the various filter types the monitoring of the operation of the apparatus for delivering electrical power, for example for delivering electrical power to a grid, in particular compliance with the network connection parameters can also be further improved. For example, if a failure of a filter is detected, the apparatus can be operated with a different switching frequency, in order to compensate for the failure of the filter and to continue meeting the grid connection conditions.

According to a further embodiment of the apparatus comparison means are provided, which using the desired and actual value of the filter current and a predefinable error criterion generate an error information signal (S). The desired value is determined using the voltage values of the three phases of the filter. Taking into consideration the currents of one phase, two phases or all three phases of the filter the actual value can then be calculated. With the known nominal values of the parts of the respective filter, which for example can be specified as parameters, or using an initial measurement of the current characteristic values of the filter, based on the knowledge of the voltage values on each phase of the filter, reference values for the filter currents can be calculated at any point in time. For the sake of simplicity, these are calculated as $\alpha\beta$ or $\alpha\beta 0$ components.

When measuring all three phases L1, L2 and L3 of the filter currents, the $\alpha\beta 0$ components can be calculated according to the following equation:

$$\begin{bmatrix} i(t)_{F,\alpha} \\ i(t)_{F,\beta} \\ i(t)_{F,0} \end{bmatrix} = \frac{1}{3} \cdot \begin{bmatrix} 2 & -1 & -1 \\ 0 & \sqrt{3} & -\sqrt{3} \\ 1 & 1 & 1 \end{bmatrix} \cdot \begin{bmatrix} i(t)_{F,L1} \\ i(t)_{F,L2} \\ i(t)_{F,L3} \end{bmatrix} \quad (1)$$

and a direct comparison of the desired and actual values of the $\alpha\beta 0$ components of the filter currents can be carried out.

When measuring just two phases L1 and L2 of the filter currents, assuming that no 0 component is present, the $\alpha\beta$ components of the filter currents are given by the following equation:

$$\begin{bmatrix} i(t)_{F,\alpha} \\ i(t)_{F,\beta} \end{bmatrix} = \begin{bmatrix} 1 & 0 \\ \frac{1}{\sqrt{3}} & \frac{2}{\sqrt{3}} \end{bmatrix} \cdot \begin{bmatrix} i(t)_{F,L1} \\ i(t)_{F,L2} \end{bmatrix} \quad (2)$$

The $\alpha\beta$ components span an orthogonal system of coordinates, from which the time-dependent complex space vector $\underline{u}_F$ can be derived. If now only the impedance for a certain frequency is considered, for example the fundamental oscillation, reference values for the filter current components in the $\alpha\beta$ system of coordinates can be determined.

But even if only one phase of the filter currents is measured, a corresponding error criterion can be determined. At a known impedance, via the measured voltage values $\underline{u}_F$ dependent also on the respectively measured current phase a reference value, for example $i_{F,ref,L1}$, can be determined and compared with the actual measured value for the filter current for example in phase L1 $i_{F,L1}$. Preferably, for example a time average value of the difference between the reference filter current of phase L1 and the measured filter current of phase L1 can be found.

The comparison of the reference value (desired value) for the current of a filter phase $i_{F,ref,L1}$ with the actual measured value of the filter current or the mean value of the difference between the two values is preferably performed in the αβ system of coordinates rotating at mains frequency. In the case of purely capacitive filters or inductive filters, this can be used to perform the comparison between reference value and actual value and actual value of the filter current in just one component of the αβ system of coordinates, for example the α component in the case of purely capacitive filters. This results in a further simplification of the apparatus and of the method to be applied.

As the error criterion for example a relative value of the deviation of the measured current from the reference current in p.u. can be indicated. For example, the error criterion can be met if the difference between the reference current and the actual value of the filter current determined is more than 10-15% of the reference current. If the error criterion is met, a corresponding error information signal is generated. It is conceivable to formulate various error criteria, in order to for example be able to identify the ageing of the components, the proper functioning of the components or the use of wrong components. The error criteria can then be evaluated by a controller and appropriate actions initiated.

There are of course other ways to determine an error information signal in single-phase current measurement. For example, this can be carried out by a direct comparison of the α and β components of the reference current and the measured current for example of phase L1 of the filter. To this end, measured variables, for example a product of the αβ components of the voltage $\underline{u}_F$ and the αβ components of the measured filter current $\underline{i}_F$ can be formed and evaluated. Clear of high-frequency harmonic components by filtering, via the product a direct value for the difference between the reference filter current and the measured filter current can be indicated.

Finally, according to a further embodiment the apparatus can be advantageously designed in that means for changing the operation of the apparatus, means for deactivating at least one filter or a filter group or means for changing the switching frequency as a function of the error information signal are provided. There exists then the possibility of continuing to operate the apparatus in a safe state, for example also when there is a defect in a filter, until a repair can be made. Thereby, compared to a deactivation of the system, greater power can be fed into the grid, meaning that the security of supply and the energy yield of the system can be increased. The means for deactivating at least one filter can, for example, be contactors, by means of which the filters can be isolated from the remainder of the three-phase system.

According to a second teaching of the present invention, the object outlined is achieved by a method for operating an apparatus for delivering electrical power in that during operation of the apparatus for delivering electrical power at least one filter current in the least one filter is determined and the at least one filter is monitored as a function of the determined filter current.

As already stated above, the present invention is characterised in that unlike in the known state of the art, monitoring of the filter functioning takes place during operation, so that even gradual changes, for example ageing of components, can be identified via the filter current measurement. Here, monitoring of the filter means continuous or discontinuous determination of the filter currents at the filter. This makes it possible to exchange components of the filter before they fail. In principle, filter current monitoring can also replace the use of fuse monitoring. This involves additional hardware, which is mounted on the fuse and provides an electrical signal as soon as the fuse has triggered. With the help of the filter current monitoring, however, it is possible to detect the triggering of a fuse via the change in current flow in the filter and thus to generate a corresponding error information signal. In this way, both the hardware and the wiring effort for the fuse monitoring can be saved. It is furthermore conceivable that the filter fuses are completely dispensed with, if means for deactivating the filter are present which can be controlled based on an error information signal of the filter current monitoring and thus allow a rapid isolation of the defective filter.

Preferably, according to a first embodiment of the method using at least one current sensor, the filter current in at least one phase of the at least one filter or a differential current of two phases of the at least one filter can be measured. This direct measurement of the filter current can for example take place by means of inductive current transformers, Rogowski current transformers or current transformers with Hall sensors. In addition, a differential current measurement can be achieved simply by the two phases having opposite directions in the current transformer.

Preferably, according to a second embodiment of the method, comparison means using the at least one filter current of at least one phase of at least one filter or at least one differential filter current of two phases of at least one filter and the measured voltage values at the at least one filter and a predefinable error criterion generate an error information signal. As already explained, in the simplest case the error criterion can merely be the deviation of the determined filter current from a reference current, preferably in the αβ system. However, there is also a possibility to calculate time mean values or fundamental oscillation-free components using the filter current determined. In this way a manipulated variable can be determined which is directly proportional to the deviation of the filter current from the reference filter current.

Monitoring of multi-stage filters, for example, split into filter groups, can according to a further embodiment of the method take place in a simple manner in that the filter current is measured in at least one phase or the differential current in two phases of a plurality of filter groups and at least to some extent the individual filter groups are monitored as a function of the determined filter currents or differential filter currents. It is then possible to identify individual filter groups as faulty in order, for example, to perform a deactivation of the filter group.

According to a further embodiment of the method it is advantageous to calculate the error information signal from a comparison between the desired and actual value of at least one filter current, for example the αβ components or from a comparison of the desired and actual value of at least one variable calculated using the determined filter current and at least one predefinable error criterion. For example, to this end a time mean value of the difference between the desired and actual value of the measured filter current phase is provided. On the other hand, the product of the αβ components of the filter voltage and the measured filter current can for example also be used as the calculated variable and compared with the product of the reference current.

Preferably, the at least one predefinable error criterion is selected as a function of the characteristic to be monitored of the at least one filter. The characteristic to be monitored of the filter can for example be the structure, the ageing of the parts or a defect. Monitoring with regard to the structure of the at least one filter and thus the use of the correct parts during assembly can for example take place at the manufacturer's by comparison of the filter criterion during the final testing of the apparatus for delivering electrical power. If the filter currents deviate too far from the calculated variables, a defective structure of the filter can be concluded. Ageing of the filter is generally indicated by a change in the characteristic values of the parts used, so that here also there is a measurable difference between reference currents and measured filter currents, which may possibly increase. Obviously, also a defect in a component of a filter can be determined by the filter current measurement.

Particularly preferably, the determination of the at least one filter current or of the at least one differential filter current can be carried out for predefined frequencies, in particular for the fundamental oscillation or a harmonic. In particular, the behaviour of the converter for the fundamental oscillation is important for the power output to a load and thus for an efficient operation of the apparatus. The measurement of the filter currents in the region of the harmonic frequencies allows a check of the damping behaviour of a filter with regard to the coupling of the harmonics of the switching frequencies of the converter into the load network. Other frequencies are also conceivable, of course, for example harmonics of the switching frequency, but the fundamental frequency and the first harmonic are the main frequencies in which filter currents are relevant.

In addition, according to a further embodiment of the method according to the invention as a function of the error information signal, the operation of the apparatus is changed, at least one filter is deactivated, and/or the switching frequency of the converter is changed. A change to the operation of the apparatus for example when there is a filter defect can lead to the adjustment of the power delivered. This, for example, makes sense if two identically built filters are provided for the same frequency, in order in this way to increase the filter performance. If one of these filters is defective, the power output of the system must be adjusted, in order not to overload the remaining functional filters. Furthermore, it is also advantageous when a fault occurs to deactivate only the corresponding filter or the corresponding filter group, in order to likewise avoid overloading of the filter for example as a result of a defective part. At the same time it may also be necessary, in the case of a filter defect, in addition to adjusting the delivered power, to change the switching frequency of the converter, in order to continue meeting the predefined mains connection conditions. If for example two filters are envisaged for the single and double switching frequency and the filter for the single switching frequency is defective, the switching frequency harmonics would be delivered unhindered into the grid. If now an increase is made to the double switching frequency, then these harmonics can be damped by the filter that is still functional.

Finally, the object outlined above is achieved by a computer program product, the execution of which allows the implementation of a method according to the invention for operating an apparatus for delivering electrical power and the monitoring of the at least one filter taking place by evaluation of the error information signal of the at least one filter. As already stated above, an apparatus for delivering electrical power can be operated with increased security via the computer program product with respect to the failure of individual mains filters or mains filter groups. The active monitoring of the filters of corresponding apparatus leads to a further optimisation of the power output, the operating times and the operational security of the apparatus. Preferably via the evaluation of the error information signal a diagnosis of the error in respect of the use of wrong components during assembly, ageing of the parts, or a defect of the filters is carried out and optionally displayed on a user interface.

BRIEF DESCRIPTION OF THE SEVERAL VIEWS OF THE DRAWING

The intention of the following is to further explain the invention using exemplary embodiments in conjunction with the drawing. The drawing shows in.

DETAILED DESCRIPTION OF THE INVENTION

Figure 1:
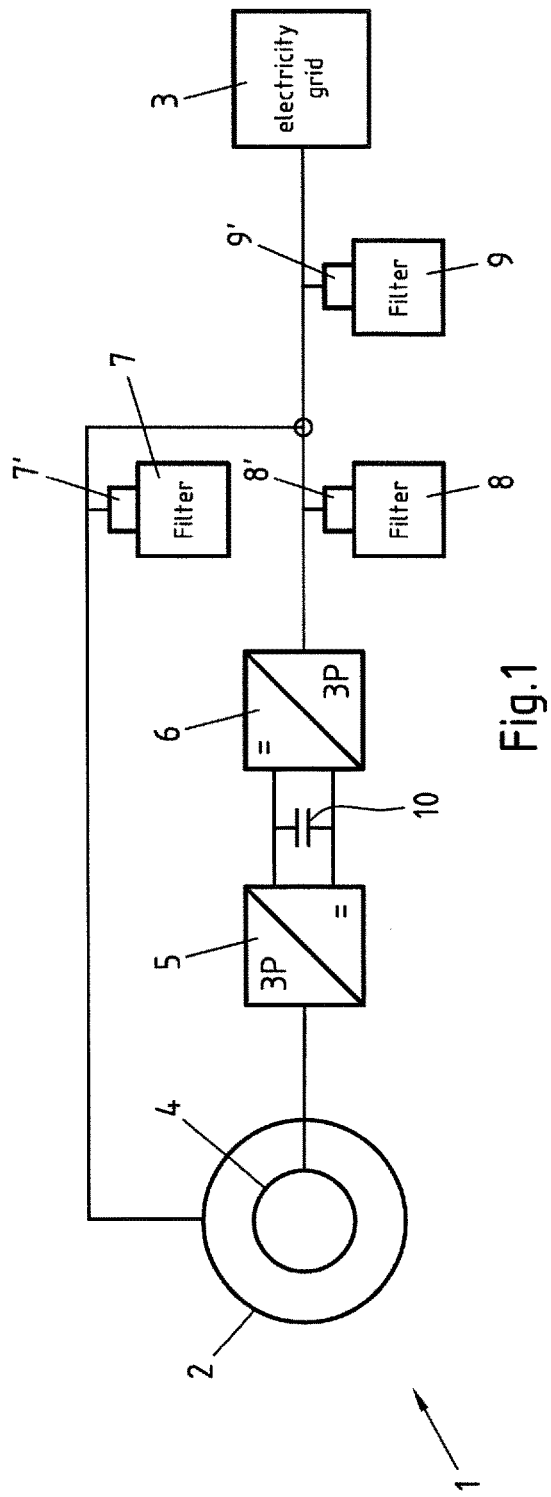
FIG. 1 shows a schematically sketched circuit diagram of an exemplary embodiment of an apparatus for delivering electrical power with a double-fed asynchronous generator.
Figure 2:
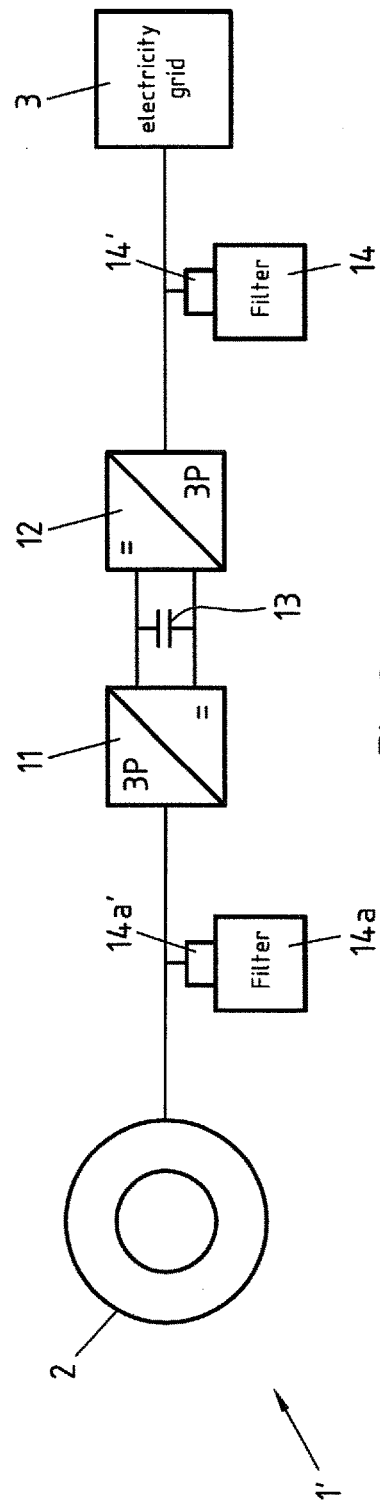
FIG. 2 shows a further exemplary embodiment of an apparatus for delivering electrical power with a synchronous generator.

FIGS. 1 and 2 show two exemplary embodiments of apparatus for delivering electrical power, as normally used in wind turbines. The apparatus in FIG. 1 comprises a generator 1, the stator 2 of which is directly connected with an electricity grid 3 which, for example represents the load impedance. The rotor 4 of the generator 1 is connected via a machine-side converter 5, a direct voltage intermediate circuit 10 and a grid-side converter 6 to the electricity grid 3. The generator is configured as an asynchronous generator and represents a double-fed asynchronous generator, as often used for wind turbines. The two converters 5 and 6 can be operated with differing switching frequencies, for which reason it may be advantageous to use separate filters 7 and 8. It is also possible, however, to use just one filter or one filter group 9. The filters 7, 8, 9 shown can thus all be considered as optional and in practice will be selected according to the intended purpose.

In the present exemplary embodiment, these are shown as filter groups 7, 8 and 9, since these are in each case configured in relation to the individual systems to be damped. Thus, the stator filter 7 must damp the effect of the stator 2 on the grid 3. The filter 8 on the other hand must match the effect of the converter 6 on the grid. The filter 9, in turn, is intended to damp the entire system comprising the grid-side converter and the stator and its repercussions on the grid 3. In the exemplary embodiment from FIG. 1 a plurality of filters are directly available, but these must be selected according to the intended purpose and thus considered as optional. The generator 1 in FIG. 1 in the form of an asynchronous generator can for example be coupled with a rotor of a wind turbine, in order in this way to convert the mechanical energy of the wind into electrical energy.

In each filter 7, 8 and 9, in the exemplary embodiment from FIG. 1, in each case means 7', 8' and 9' are provided, with which the filter currents can be determined in the respective filters 7, 8 and 9.

FIG. 2 shows an exemplary embodiment of an apparatus according to the invention with a generator 1', the stator 2 of which is connected via a machine-side converter 11, a direct voltage intermediate circuit 13 and a grid-side converter 12 to the grid 3. The generator 1' can for example have a permanently excited rotor, so that unlike the configuration in FIG. 1 the entire power output takes place via the converter 12 on the grid 3. Here the mains filters 14 is intended to adjust the effect of the converter 12 to the grid. The filter 14 must in this regard also be configured for delivering high powers and can for example be configured to increase the filter performance of a plurality of identically built filters for the same frequency, not shown here. These filters can also be combined to form individual filter groups. Additionally, a filter 14a can be provided, to damp the effects of the converter 11 on the generator 1' and vice versa. This filter also contains means for determining at least one filter current 14a'.

In general, however, instead of the generator 1 or 1' an apparatus for delivering electrical power can also have other means for providing electrical energy, for example a photovoltaic system, providing a direct current, delivered via converters 6, 12 into an electricity grid.

According to the invention, in the apparatus according to FIG. 1 and FIG. 2 means for determining at least one filter current 7', 8', 9' or 14' are provided, configured such that these allow a determination of the at least one filter current of the at least one filter 7, 8, 9 or 14 during operation of the apparatus. In at least one of the filters 7, 8, 9 or 14 used, preferably means for direct measurement of filter currents can be provided. The determined or directly measured filter currents serve for monitoring the individual filters and ensure that the correct functioning of the filters during operation of the apparatus is known. With the apparatus for delivering electrical power shown in FIG. 1 and FIG. 2 it is thus possible, using the filter current determination during operation to monitor the functioning of the filters and to intervene directly in the event of ageing, defective structure or a defect.

The means 7', 8', 9', 14' or 14a' optionally have means for deactivating the filter or isolating the filter in order, for example in the event of a defect, to be able to isolate this from the apparatus.

Figure 3:
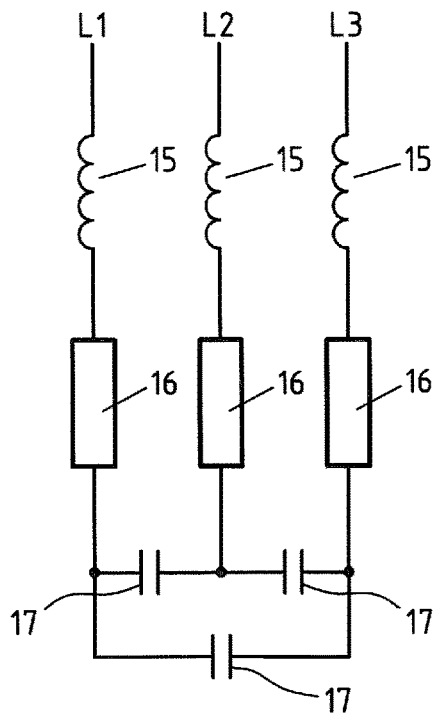
FIG. 3 shows a schematic circuit diagram of an exemplary embodiment of a first filter topology.
Figure 4:
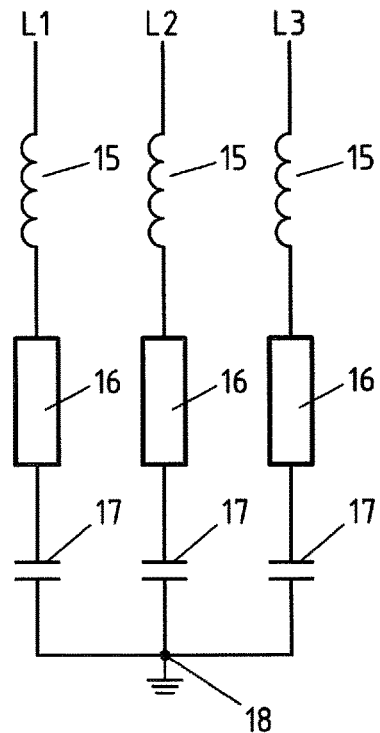
FIG. 4 shows a schematic circuit diagram of an exemplary embodiment of a second filter topology.
Figure 5:
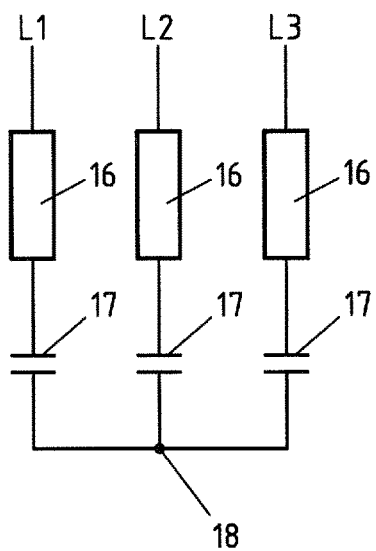
FIG. 5 shows a schematic circuit diagram of an exemplary embodiment of a third filter topology.

The specific structure of typically used filter topologies are shown by the schematic circuit diagrams of FIG. 3, FIG. 4 and FIG. 5. FIG. 3 shows what is known as an absorption circuit in a delta connection. The three filter phases L1, L2, L3 in each case contain an inductance 15, a resistor 16 and a capacitor 17. The three phases L1, L2 and L3 of the absorption circuit from FIG. 3 are in each case connected via a capacitor 17, so that a delta connection is formed. With the exemplary embodiment of a filter shown as an absorption circuit in a star connection in FIG. 4, the three filter phases L1, L2, L3 are interconnected at a central point 18. The star point 18 can also have zero potential. In turn, the individual phases comprise an inductance 15, a resistor 16 and a capacitor 17.

FIG. 5 shows a star-shaped circuit having an RC filter formed merely of one resistor 16 and one capacitor 17 per phase. Here also, the filter phases L1, L2 and L3 are joined at the star point 18.

The filter topologies shown in FIG. 3-FIG. 5 represent only a small sample of the possible filter types, however. Also, the filters can be designed as a high-pass, low-pass, absorption circuit or RC filter or also a higher order filter. Irrespective of their design, however, all filters have connections for all three phases L1, L2 and L3, suitable for measuring filter currents. Furthermore, all filters usually have a symmetrical design in relation to the individual phases L1, L2 and L3.

Figure 6:
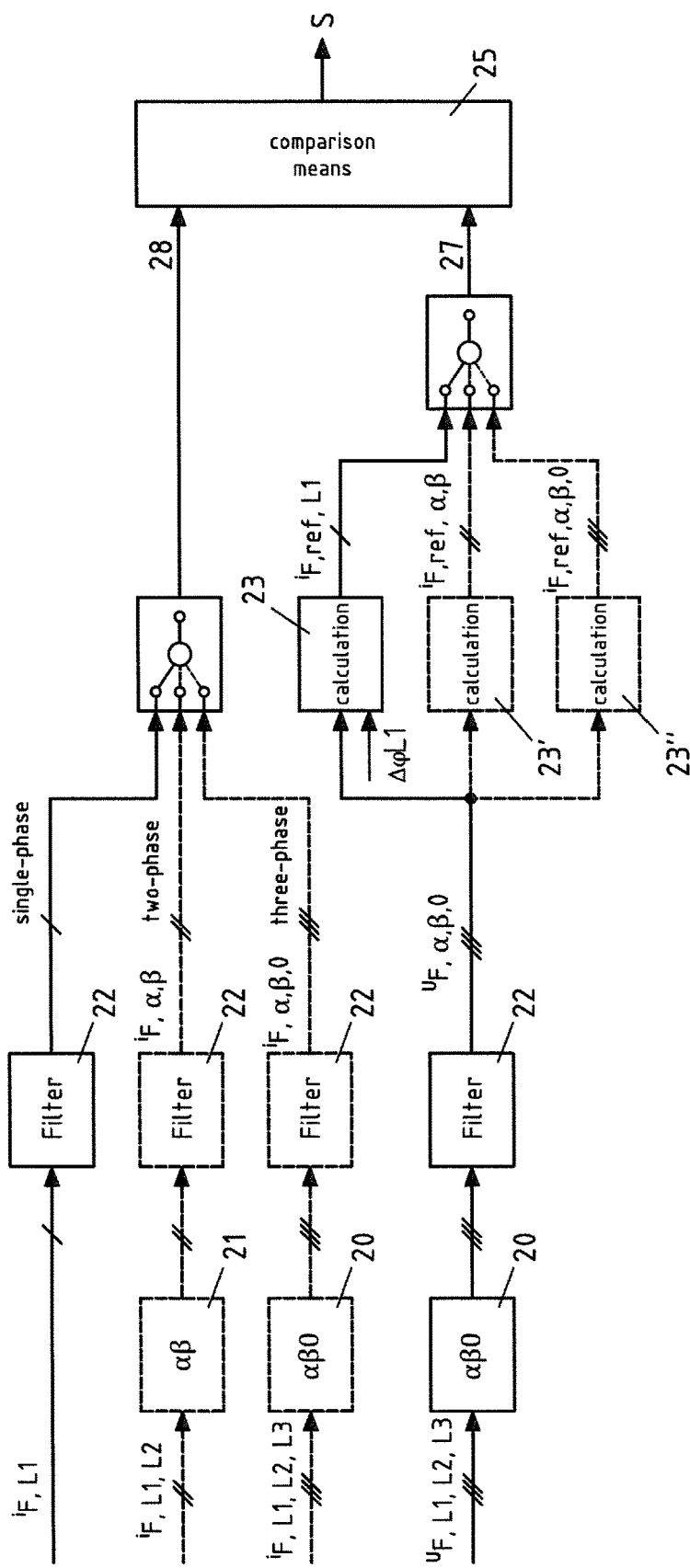
FIG. 6 shows a flow diagram of exemplary embodiments of the method according to the invention for filter monitoring.

FIG. 6 then shows a flow diagram for exemplary embodiments of the method according to the invention in single-phase, two-phase or three-phase current measurement.

In the exemplary embodiment with single-phase current measurement, at least one filter current is determined, for example the filter current $i_{F,L1}$ of phase L1. The voltage values at the filter up of phases L1, L2 and L3 are available, since as can be seen from FIG. 1 and FIG. 2, these correspond to the mains voltage and a measurement of this voltage is in any case needed for controlling the converter.

From the voltage values for the phases L1, L2 and L3, in step 20 via a αβ0 transformation, the components in the αβ0 system of the voltage are determined. The following equation is used for this purpose:

$$\begin{bmatrix} u(t)_{F,\alpha} \\ u(t)_{F,\beta} \\ u(t)_{F,0} \end{bmatrix} = \frac{1}{3} \cdot \begin{bmatrix} 2 & -1 & -1 \\ 0 & \sqrt{3} & -\sqrt{3} \\ 1 & 1 & 1 \end{bmatrix} \cdot \begin{bmatrix} u(t)_{F,L1} \\ u(t)_{F,L2} \\ u(t)_{F,L3} \end{bmatrix} \quad (3)$$

A filter 22 then determines the values of the αβ0 components of the voltage but also of the measured filter current $i_{F,L1}$ for a predefined frequency, for example the fundamental oscillation or the first harmonic of the switching frequency.

Taking into consideration the fixed angular relationship between the phases L1, L2 and L3 in the αβ0 system, taking into consideration for example Δφ from the measured voltage values, a reference filter current value $i_{F,ref,L1}$ for phase L1 is calculated. The respective phase angle Δφ to be taken into consideration is dependent as follows on the respectively measured phase for the filter current or the differential filter current:

TABLE 1

| Measurement | $i_{F,L1}$ | $i_{F,L2}$ | $i_{F,L3}$ | $i_{F,L1}-i_{F,L2}$ | $i_{F,L2}-i_{F,L3}$ | $i_{F,L3}-i_{F,L1}$ |
|---|---|---|---|---|---|---|
| $\Delta\varphi$ | 0 | $\frac{2\pi}{3}$ | $\frac{-2\pi}{3}$ | $\frac{-\pi}{6}$ | $\frac{\pi}{2}$ | $\frac{-5\pi}{6}$ |

The reference current $i_{F,ref,L1}$ is, for example, calculated by means of the characteristic values for the parts used, thus the known inductances, resistors and capacitors in the aαβ0.

Figure 7:
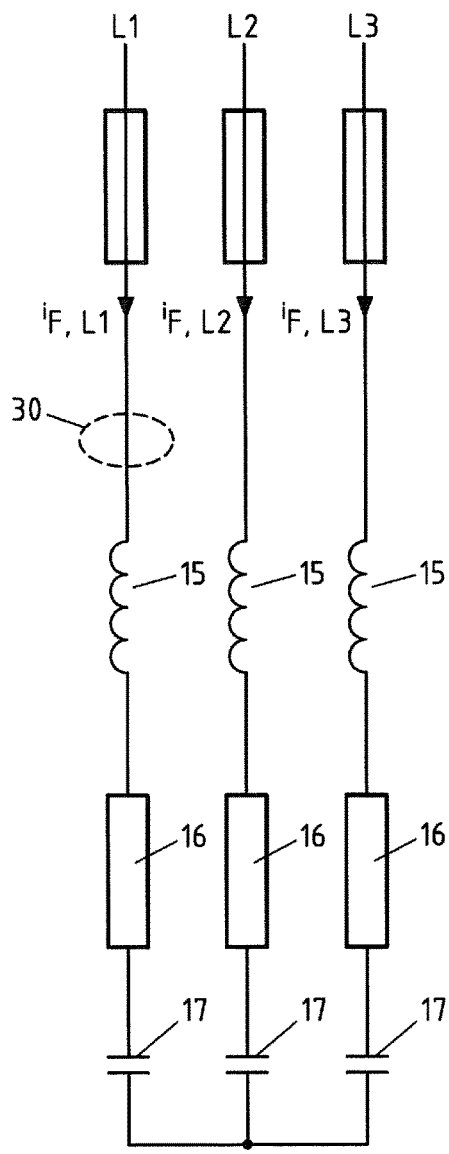
FIG. 7 shows an exemplary embodiment with a current transformer for determining a filter current phase of a filter in a star connection.

If, for example, an absorption circuit in a star connection, as shown in FIG. 7, is used as a filter and if via a current sensor 30, for example in the form of an inductive current transformer the phase L1 is measured, then for example when taking into account the fundamental oscillation ω in the αβ system of coordinates rotating at mains frequency the αβ components of the filter voltage $u_F$ are given by the following:

$$\underline{u}_{F\alpha\beta0} = u_{F,\alpha} + j \cdot u_{F,\beta} = u_F \cdot e^{j(\omega t + \varphi_u)} = u_F \cdot ((\cos(\omega t + \varphi_u) + j \cdot \sin(\omega t + \varphi_u)) \quad (4)$$

and through multiplication by $e^{-j\omega t}$ $$\underline{u}_F = \underline{u}_{F\alpha\beta0} \cdot e^{-j\omega t} = u_F \cdot (\cos(\varphi_u) + j \cdot \sin(\varphi_u)) \quad (4a)$$

The calculation of the two αβ components of the reference current $i_{F,ref}$ is then performed from $$i_{F,ref} = i_{F,ref,\alpha} + j \cdot i_{F,ref,\beta} = \frac{u_F}{Z_F} \quad (5)$$

where:

$$\underline{Z}_F = R_F(\omega) + j \cdot X_F(\omega) \quad (6)$$

In this way the two components are obtained for the reference value of the filter current, which is dependent merely on the known reference values for the impedance and the respectively measured filter voltages:

$$i_{F,ref,\alpha} = \frac{u_{F,\alpha} \cdot R_F(\omega) + u_{F,\beta} \cdot X_F(\omega)}{\sqrt{R_F(\omega)^2 + X_F(\omega)^2}} \quad (7)$$

$$i_{F,ref,\beta} = \frac{-u_{F,\alpha} \cdot X_F(\omega) + u_{F,\beta} \cdot R_F(\omega)}{\sqrt{R_F(\omega)^2 + X_F(\omega)^2}}$$

In order to obtain the single-phase reference current $i_{F,ref,L1}$, the vector must still be projected onto the axis of the actual measured current with the angle $\Delta\varphi$ from Table 1 given by the embodiment of the measurement. This is obtained by the following equation:

$$i_{F,ref,L1} = \text{Re}\{\underline{i}_{F,ref} \cdot e^{-j \cdot \Delta\varphi}\} = i_{F,ref,\alpha} \cdot \cos(\Delta\varphi) + i_{F,ref,\beta} \cdot \sin(\Delta\varphi) \quad (8)$$

Figure 10:
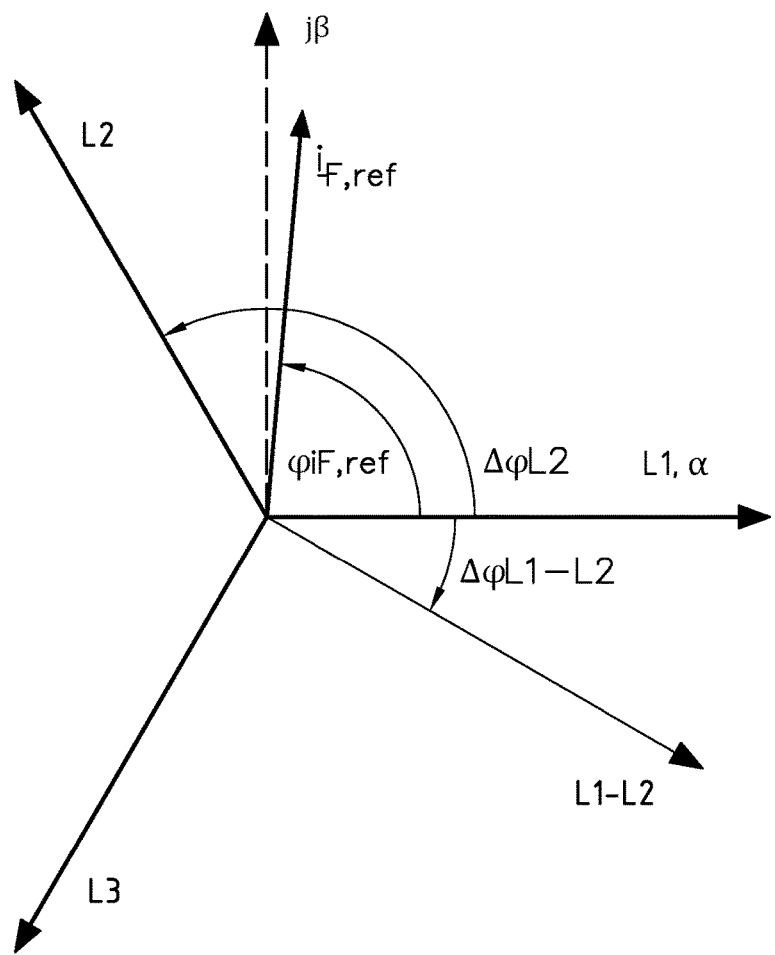
FIG. 10 shows a space vector diagram in the αβ system of coordinates.

In FIG. 10 the associated space vectors are shown, giving the projections when using the individual phases L1, L2 or L3, in particular also when taking into consideration differential current measurements, and therefore corresponds to a representation of the difference angle from Table 1 in the αβ system of coordinates rotating at mains frequency.

Figure 8:
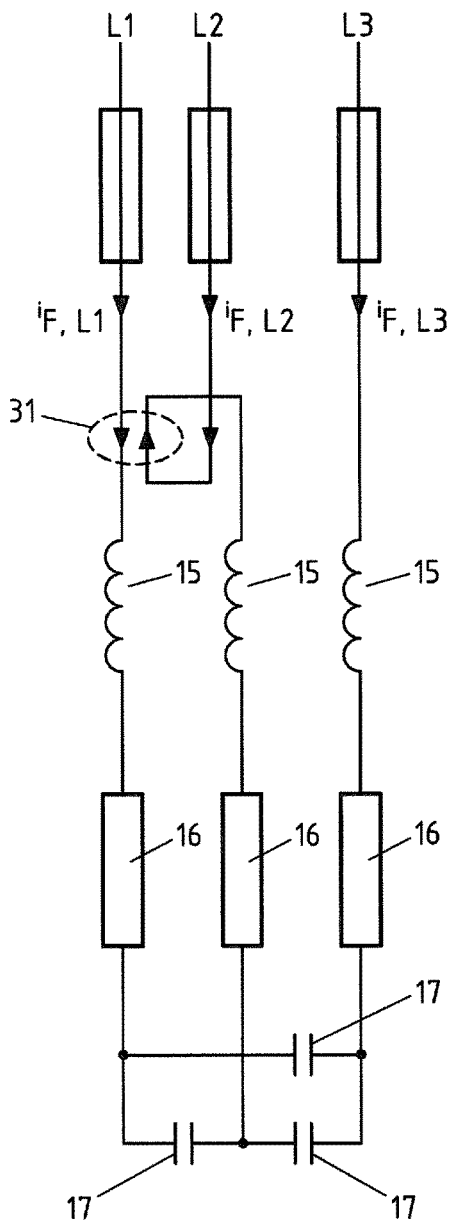
FIG. 8 shows a sketched circuit diagram of an exemplary embodiment with a current sensor for measuring the differential currents of two phases of a filter in a delta connection.

According to a further exemplary embodiment, as shown in FIG. 8, using a current sensor 31 a filter current difference, for example a filter current difference between phases L1 and L2 can be measured. In this case, for the calculation of the reference current another difference angle $\Delta\varphi$ is used. As can be seen from the table, an angle of $-\pi/6$ must then be used.

In the comparison means 25 shown in FIG. 6 for example the difference between measured phase current $i_{F,L1}$ and the actual value 28, can then be determined in the filter with the reference filter current $i_{F,ref,L1}$ of phase L1, thus the desired value 27. Preferably here a time mean value of the difference is formed to minimise possible measurement uncertainties and measurement fluctuations, i.e. measurement errors. The mean value of the difference is given by $$\Delta i_{F,L1,MW}(t) = \frac{1}{T} \int_t^{t+T} (i_{F,ref,L1}(\tau) - i_{F,L1}(\tau)) d\tau \quad (9)$$

The time mean value of the desired value is given by $$i_{F,ref,L1,MW}(t) = \frac{1}{T} \int_t^{t+T} i_{F,ref,L1}(\tau) d\tau \quad (10)$$

Via the comparison means 25 by means of an error criterion, an error information signal S can then be generated, if the following equation is satisfied:

$$\Delta i_{F,L1,MW}(t) > i_{F,ref,L1,MW}(t) \cdot \text{limit}_{F,rel} \quad (11)$$

$\text{limit}_{F,rel}$ is the error criterion and a predefined value which, for example, is between 10% and 15% for the monitoring of a filter defect and gives the width of the permitted deviations relative to the reference filter current. This value can be freely selected. The error information signal S can then be further evaluated. Depending on the characteristic to be monitored of the filter, so e.g. the structure, ageing or defect, various error criteria can be selected, the values of which are matched to the corresponding application.

Furthermore, FIG. 6 shows two further embodiments, in which two phases, for example phases L1 and L2 or also all three phases L1, L2, L3 are measured using current sensors.

When measuring two current phases L1 and L2, these can be transformed via the following transformation 21 in an αβ system:

$$\begin{bmatrix} i(t)_{F,\alpha} \\ i(t)_{F,\beta} \end{bmatrix} = \begin{bmatrix} 1 & 0 \\ \frac{1}{\sqrt{3}} & \frac{2}{\sqrt{3}} \end{bmatrix} \cdot \begin{bmatrix} i(t)_{F,L1} \\ i(t)_{F,L2} \end{bmatrix} \quad (12)$$

When measuring all three filter current phases the transformation 20 of the filter currents in the αβ0 system is given by the equation (1).

$$\begin{bmatrix} i(t)_{F,\alpha} \\ i(t)_{F,\beta} \\ i(t)_{F,0} \end{bmatrix} = \frac{1}{3} \cdot \begin{bmatrix} 2 & -1 & -1 \\ 0 & \sqrt{3} & -\sqrt{3} \\ 1 & 1 & 1 \end{bmatrix} \cdot \begin{bmatrix} i(t)_{F,L1} \\ i(t)_{F,L2} \\ i(t)_{F,L3} \end{bmatrix} \quad (13)$$

Following a filter 22 at the frequency to be considered, in the αβ0 or αβ system of coordinates the components according to step 23' or 23" of the reference filter currents are calculated and compared with the αβ components or αβ0 components of the measured filter currents for determination of an error criterion.

FIG. 7 and FIG. 8 show exemplary embodiments of filter current measurements or differential filter current measurements. In FIG. 7 in phase L1 a current sensor 30, for example a Rogowski current transformer or a current transformer with a Hall sensor is arranged which measures the magnetic flow generated by the current flow to determine the current flow. These current transformers 30 demonstrate good accuracy and a robust measurement behaviour and their measurement range can be precisely matched to the filter currents, allowing optimum resolution of measured values to be achieved. As can be seen from FIG. 8, with a single current sensor 31 a differential current can be measured directly by an arrangement of the phases L1 and L2 counter to one another in the current sensor 31.

By measuring the filter currents also in just one phase of the filter it is possible to identify a change in the impedance of the filter early. Table 2 shows the different kinds of errors that can be detected during single-phase, two-phase or three-phase measurement.

As can be seen, even with a single-phase filter current measurement, so with particularly low measurement effort, in a star connection of the filters both a supply line breakage and deviation from the rated value of a component of the filter can be detected. For a filter in a delta connection to this end the measurement of a differential phase current Δi must be performed. In Table 2 n/a=not applicable, x=identification possible, ---=identification not possible, I=single-phase current measurement, Δi=differential current measurement of two phases.

TABLE 2

| | Measurement | | | | | | | | |
|---|---|---|---|---|---|---|---|---|---|
| | 3-phase | | | 2-phase | | | 1-phase | | |
| Error type | Star | Star-N | Delta | Star | Star-N | Delta | Star | Star-N | Delta |
| N open | n/a | x | n/a | n/a | — | n/a | n/a | — | n/a |
| Supply line interruption | x | x | x | x | x | x | x | x | x |
| Deviation from component rated value | x | x | x | x | x | x | i | i | Δi |

Monitoring of the filter currents is in particular advantageous in apparatus for delivering electrical power, which can only be accessed with difficulty, for example offshore systems, since the filter monitoring takes place electronically and ageing processes, which are particularly important in capacitors, can be identified in advance. Furthermore, there are particular advantages in the continued operation of the systems being enabled by deactivating individual filter groups using corresponding means for isolating the filter groups.

Figure 9:
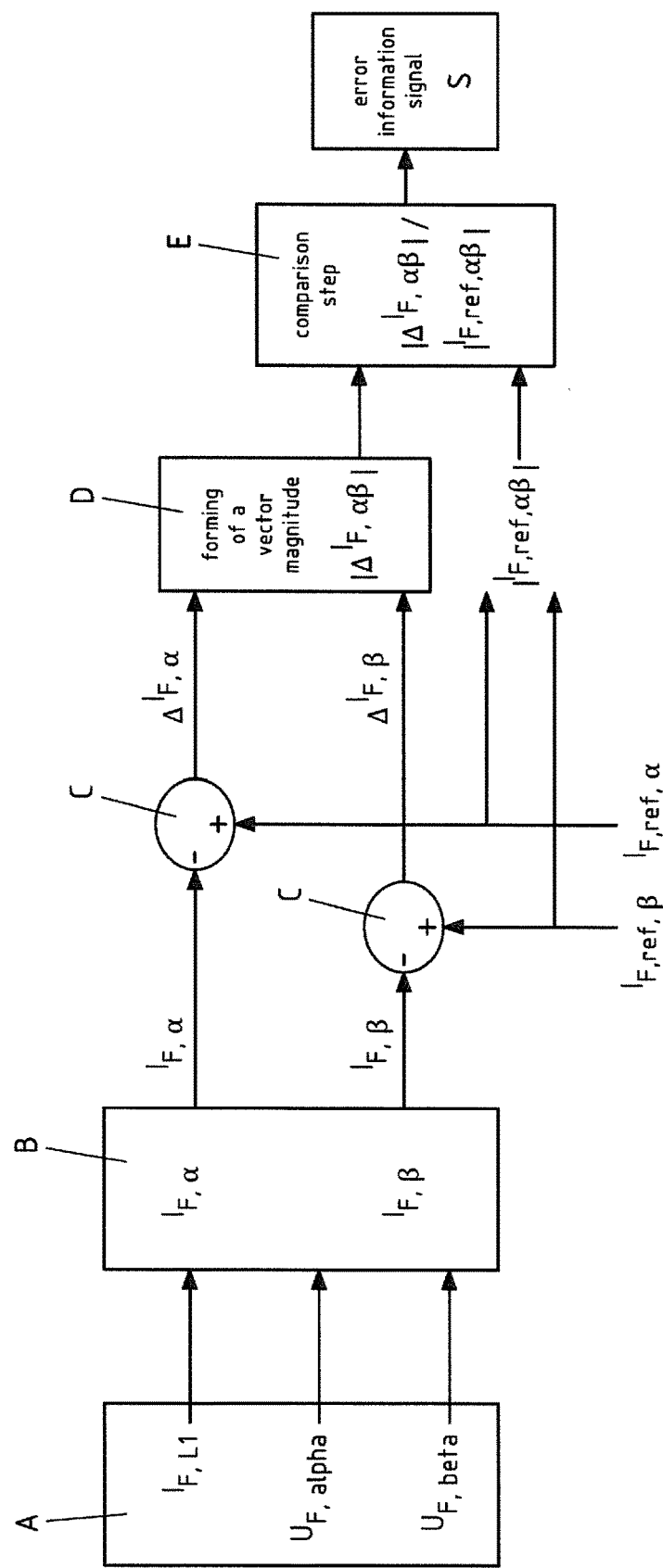
FIG. 9 shows a schematic flow diagram of an exemplary embodiment of the method according to the invention during measurement of just one filter current phase.

With reference to FIG. 9 a further exemplary embodiment is to be specified, in which a direct comparison between the αβ components of the filter current $I_{F,L1}$ measured in one phase is carried out.

To this end, initially in step A the filter current measured in phase L1, taking into consideration the available voltage values $U_{f,alpha}$ and $u_{f,beta}$, in the αβ0 system of coordinates, the components of the measured filter current $i_F$ are calculated in the αβ system rotating at mains frequency in step B. Then a difference is calculated between the respective αβ components $I_{F,\alpha}$ and $I_{F,\beta}$ of the filter currents measured in step C and the reference values of the filter current of the αβ components $I_{F,ref,\alpha}$ and $I_{F,ref,\beta}$. From the difference vector having difference values $_\Delta I_{F,\alpha}$ and $_\Delta I_{F,\beta}$ in the αβ system of coordinates according to step D the absolute value is found and fed to a comparison step E. In the comparison step E the absolute value of the difference vector in the αβ system is compared with the absolute value of the filter current reference vector $I_{F,ref,\alpha\beta}$ and for example a quotient is formed and compared with an error criterion in p.u. From this an error information signal S can then be generated.

Figure 11:
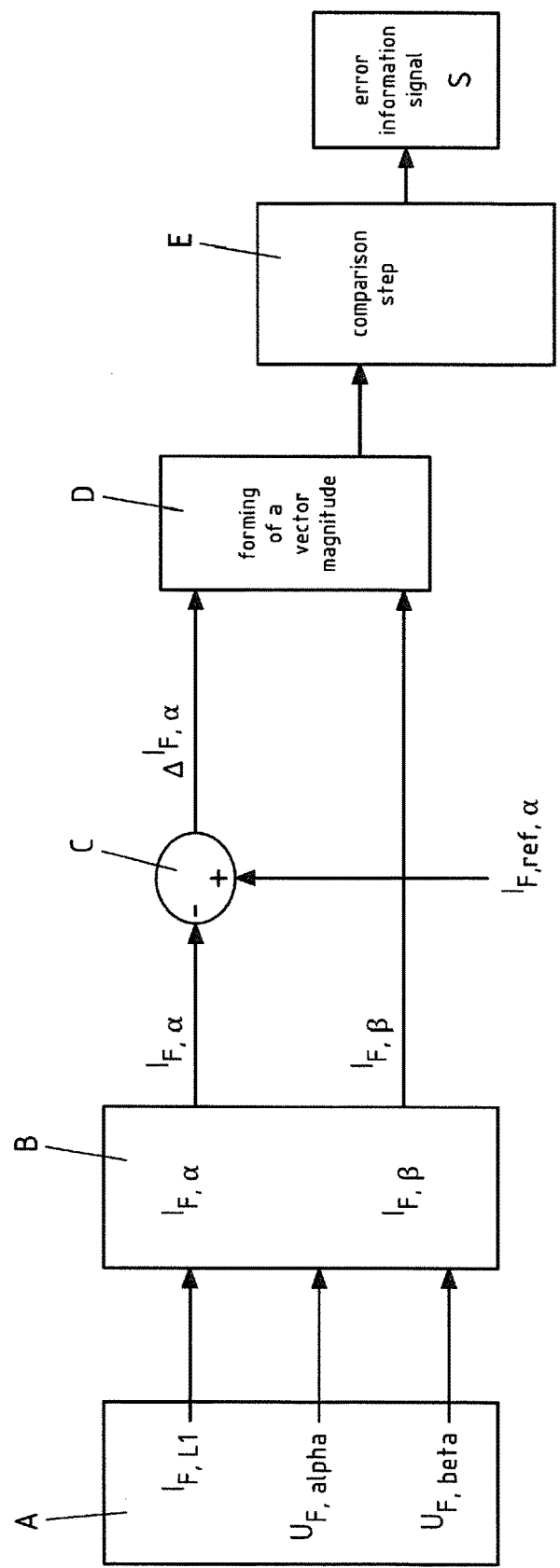
FIG. 11 shows a schematic flow diagram of a further exemplary embodiment of the method according to the invention.

A further exemplary embodiment is shown in FIG. 11, representing a simplification of the exemplary embodiment from FIG. 9. Assuming that the voltage component lies in the β axis and the filter current component lies in the α axis, the method according to the invention can insofar be simplified, in that a difference calculation only has to be carried out in one of the αβ components $I_{F,\alpha}$ and $I_{F,\beta}$. This is, for example, the case for a capacitive filter with sufficient accuracy.

Similarly to FIG. 9 in FIG. 11 initially in step B, from the filter current $I_{F,L1}$ measured in phase L1 taking into consideration the available voltage values $U_{F,alpha}$ and $U_{F,beta}$ in the αβ0 system of coordinates, the components of the measured filter current $I_{F,\alpha}$ and $I_{F,\beta}$ are calculated in the αβ system of coordinates rotating at mains frequency. The difference is then formed only between the α component $I_{F,\alpha}$ and the reference value of the α component of the filter current $I_{F,\alpha}$ to give difference value $_\Delta I_{F,\alpha}$. In step D, from the α component $_\Delta I_{F,\alpha}$ and the β component $I_{F,\beta}$ the vector magnitude is formed. This value can then be compared in the comparison step E with a predefinable error criterion. This can, for example, be formed by considering the desired value of the α component of the filter current $I_{F,ref,\alpha}$. From the comparison, an error information signal S can then be generated and, for example, cause a change in the operating state of the apparatus for delivering electrical energy. Similarly to the α component $I_{F,\alpha}$, it is also conceivable to use the corresponding β component $I_{F,\beta}$ for the comparison with the reference variable, provided the condition that the component of the filter currents lies in this axis is met.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An apparatus for delivering electrical power, in particular for delivering regeneratively produced electrical power to a load impedance, having at least one converter and at least one filter,
characterised in that
means for determining at least one filter current of at least one filter are provided, which are designed to allow a determination of the at least one filter current during operation of the apparatus, wherein comparison means are provided, which using the desired value and actual value of the filter current and a predefinable error criterion generate an error information signal, wherein as means for determining the at least one filter current only one single phase current sensor for measuring the current in only one phase of the at least one filter is provided or two single phase current sensors for measuring the current in only two phases of the at least one filter are provided or at least one current sensor configured to measure the differential filter current between two phases of the at least one filter are provided.

2. An apparatus for delivering electrical power, in particular for delivering regeneratively produced electrical power to a load impedance, having at least one converter and at least one filter,
characterised in that
means for determining at least one filter current of at least one filter are provided, which are designed to allow a determination of the at least one filter current during operation of the apparatus, wherein comparison means are provided, which using the desired value and actual value of the filter current and a predefinable error criterion generate an error information signal, wherein as means for determining the at least one filter current a current sensor for measuring the current in only one phase or at least one current sensor for measuring the current in only two phases of the at least one filter are provided;
wherein at least one current sensor is provided, configured to measure the differential filter current between two phases of at least one filter.

3. The apparatus according to claim 1,
characterised in that
at least one filter group is provided and the means for determining the filter currents are designed to at least to some extent allow a determination of the filter currents or differential filter currents of the individual filter groups.

4. The apparatus according to claim 1,
characterised in that
the apparatus for delivering electrical power has a mains connection and at least one mains filter is provided.

5. The apparatus according to claim 1,
characterised in that
the apparatus for delivering electrical power is a wind turbine with a double-fed asynchronous generator or a wind turbine with a synchronous generator.

6. The apparatus according to claim 1,
characterised in that
the at least one filter is configured as an absorption circuit, high-pass, low-pass or RC filter or as a higher-order filter.

7. The apparatus according to claim 1,
characterised in that
means for changing the operation of the apparatus, means for deactivating at least one filter or a filter group, or means for changing the switching frequency as a function of the error information signal, are provided.

8. A method for operating an apparatus for delivering electrical power, in particular for delivering regeneratively produced electrical power to a load impedance, according to claim 1, wherein the apparatus has at least one converter and at least one filter,
characterised in that
during operation of the apparatus for delivering electrical power at least one filter current in the at least one filter is determined and the at least one filter is monitored dependent on the determined filter current, wherein comparison means are provided, which using the desired value and the actual value of the filter current and a predefinable error criterion generate an error information signal.

9. The method according to claim 8,
characterised in that
using at least one current sensor the filter current in at least one phase of the at least one filter or a differential filter current of two phases of the at least one filter is measured.

10. The method according to claim 8,
characterised in that
comparison means generate an error information signal using the at least one filter current of at least one phase of at least one filter or at least one differential filter current of two phases of at least one filter and the measured voltage values at the at least one filter and a predefinable error criterion.

11. The method according to claim 8,
characterised in that
the filter current is measured in each case in at least one phase or in each case the differential filter current of two phases of at least one filter group and at least to some extent the individual filter groups are monitored dependent on the determined filter currents or differential filter currents.

12. The method according to claim 8,
characterised in that
the error information signal is calculated from a comparison between the desired and actual values of at least one filter current or from a comparison of the desired and actual values of at least one variable calculated using the determined filter current and at least one predefinable error criterion.

13. The method according to claim 8, characterised in that the at least one predefinable error criterion is selected dependent on the characteristic to be monitored of the least one filter.

14. The method according to claim 8, characterised in that the determination of the at least one filter current or of the at least one differential filter current is carried out for predefined frequencies, in particular for the fundamental oscillation or a harmonic.

15. The method according to claim 8, characterised in that dependent on the error information signal, the operation of the apparatus is changed, at least one filter is deactivated, and/or the switching frequency of the converter is changed.

16. A computer program product, during the execution of which by means of a computer a method according to claim 8 is carried out and the monitoring of the at least one filter takes place by evaluation of the error information signal of the associated filter.

* * * * *